United States Patent
Yamasaki et al.

(10) Patent No.: US 7,063,871 B2
(45) Date of Patent: Jun. 20, 2006

(54) CVD PROCESS CAPABLE OF REDUCING INCUBATION TIME

(75) Inventors: Hideaki Yamasaki, Nirasaki (JP); Tatsuo Hatano, Nirasaki (JP); Tsukasa Matsuda, Nirasaki (JP); Taro Ikeda, Nirasaki (JP); Kazuhito Nakamura, Nirasaki (JP); Koumei Matsuzawa, Nirasaki (JP); Yumiko Kawano, Nirasaki (JP); Mitsuhiro Tachibana, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 372 days.

(21) Appl. No.: 10/617,819

(22) Filed: Jul. 14, 2003

(65) Prior Publication Data

US 2004/0025789 A1 Feb. 12, 2004

(30) Foreign Application Priority Data

Jul. 15, 2002 (JP) ............................. 2002-205516

(51) Int. Cl.
*C23C 16/16* (2006.01)

(52) U.S. Cl. ...................................... 427/250; 427/252
(58) Field of Classification Search ................ 427/250, 427/252
See application file for complete search history.

(56) References Cited

U.S. PATENT DOCUMENTS

| 2,759,848 | A | * | 8/1956 | Sullivan ...................... 427/252 |
| 2,956,909 | A | * | 10/1960 | Robinson .................... 427/123 |
| 4,405,878 | A | * | 9/1983 | Oliver .................... 313/346 R |
| 4,619,840 | A | * | 10/1986 | Goldman et al. ........... 438/681 |
| 5,060,595 | A | * | 10/1991 | Ziv et al. .................... 118/722 |
| 5,753,320 | A | * | 5/1998 | Mikoshiba et al. ......... 427/572 |
| 6,218,301 | B1 | | 4/2001 | Yoon et al. |
| 6,924,223 | B1 | * | 8/2005 | Yamasaki et al. ........... 438/622 |
| 2003/0008070 | A1 | | 1/2003 | Seutter et al. |

FOREIGN PATENT DOCUMENTS

WO      WO 02/48427 A1    6/2002

* cited by examiner

*Primary Examiner*—Bret Chen
(74) *Attorney, Agent, or Firm*—Crowell & Moring LLP

(57) ABSTRACT

A metal CVD process includes a step (A) of introducing a gaseous source material containing a metal carbonyl compound into a process space adjacent to a surface of a substrate to be processed in such a manner that the metal carbonyl compound has a first partial pressure, and a step (B) of depositing a metal film on the surface of the substrate by introducing a gaseous source material containing the metal carbonyl compound into the process space in such a mater that the metal carbonyl compound has a second, smaller partial pressure. The step (A) is conducted such that there is caused no substantial deposition of the metal film on the substrate.

11 Claims, 10 Drawing Sheets

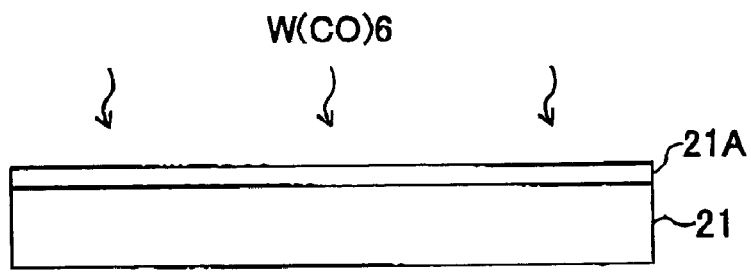
FIG.3A
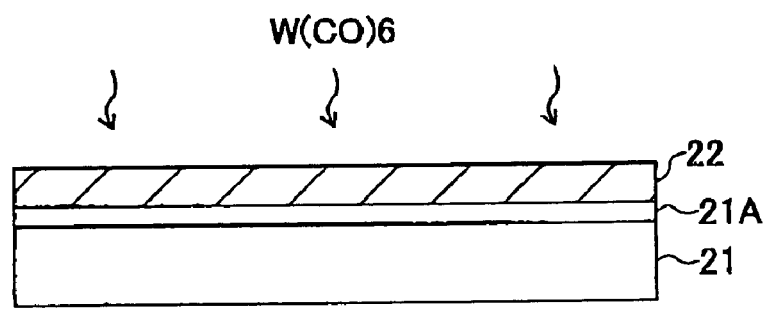
FIG.3B
FIG.4
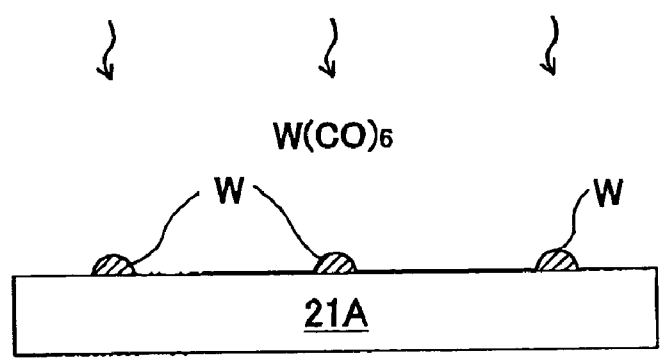

CVD PROCESS CAPABLE OF REDUCING INCUBATION TIME

BACKGROUND OF THE INVENTION

The present invention generally relates to fabrication of semiconductor devices and more particularly to the method of forming a metal film by a CVD process while using a metal carbonyl compound as a source material.

CVD (chemical vapor deposition) is a fundamental and important film-formation process used in the production of various semiconductor devices. As the film formed by a CVD process can achieve excellent step coverage even when the film is deposited on a complex structure having a large aspect ratio, the CVD process is used extensively for forming insulation films, semiconductor films and metal films in the fabrication process of semiconductor devices or display devices such as a liquid display panel.

Particularly, the pyrolitic CVD process of a metal film conducted by using a metal carbonyl source material is important in relation to the technology of multilayer interconnection in view of the fact that the process can form a refractory metal film such as a W film on an insulation film such as an $SiO_2$ film directly with low specific resistance.

Conventionally, CVD of a W film has been conducted by using a source material such as $WF_6$ or $WCl_6$ by causing a reduction reaction in such a W-containing source compound by using $H_2$, $SiH_4$ or $NH_3$. According to such a process, however, it has been difficult to deposit a W film on an insulation film such as an $SiO_2$ film.

On the other hand, there is proposed a technology capable of forming a W film on an $SiO_2$ film by using $W(CO)_6$ as a CVD source material. According to this proposal, a W film is formed by conducting a pyrolytic decomposition reaction of $W(CO)_5$ as follows.

$$W(CO)_6 \rightarrow W+6CO.$$

Typically, the CVD process of a W film using a $W(CO)_6$ source material is conducted under the pressure of about 7 Pa (0.5 Torr) or less while setting the substrate temperature to about 500° C. Under such a condition, the deposition of the W film occurs immediately with commencement of the process, even in the case the process is conducted on an $SiO_2$ film. Thereby, a high-quality W film is obtained with high throughput.

Meanwhile, there is an increasing tendency, in recent ultrahigh-speed semiconductor devices, of using a so-called low-K dielectric film having a characteristically small dielectric constant as compared with an $SiO_2$ film, for the interlayer insulation film of a multilayer interconnection structure.

Because such a low-K insulation film generally has a poor heat resistance, it is necessary to conduct a deposition process at the substrate temperature lower than 500° C., such as about 400° C. or less, in the case a W film is to be deposited on such a low-K dielectric insulation film by using the CVD process that uses such a metal carbonyl compound as the source material.

FIG. 1 shows the relationship between the duration of deposition (deposition time) and the thickness of the W film observed by the inventor of the present invention in the experimental investigation that constitutes the foundation of the present invention. In this investigation, the W film was deposited by using $W(CO)_6$ as the source material at the substrate temperature of less than 500° C.

More specifically, the experiment of FIG. 1 was conducted under the process pressure of about 8 Pa (0.06 Torr) at the substrate temperature of 413° C. while supplying a 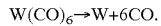$W(CO)_6$ source gas from a source bottle holding therein the $W(CO)_6$ source material at 25° C., by causing a bubbling in the source bottle by an Ar carrier gas with a flow rate of 50 SCCM.

Referring to FIG. 1, it can be seen that the deposition of the W film on the substrate does not occur immediately after the commencement of the deposition process. The deposition of the W film starts only after an incubation time of about 5 minutes has elapsed. After the incubation time, it can be seen that the thickness of the W film increases generally linearly with the deposition time.

Thus, the relationship of FIG. 1 indicates that it is possible to form a W film on an $SiO_2$ film with high precision also at such a low temperature by controlling the duration of the deposition process. On the other hand, the existence of such an incubation time inevitably decreases the throughput of the W-film formation process. In the case of a single-wafer process, in which substrates of large diameter are processed one by one, in particular, there is caused a waiting time for each wafer in correspondence to the foregoing incubation time, and a serious degradation of process throughput is caused for the overall process of semiconductor device production.

It should be noted that this incubation time increases when the substrate temperature is decreased and can reach as much as 600 seconds or more.

In the case of forming a W film by the pyrolytic decomposition process of $W(CO)_6$ under the process pressure of 0.1 Torr at the substrate temperature of 338° C. by setting the bubbler temperature to 30° C. and the flow rate of the gaseous source material containing $W(CO)_6$ to 50 SCCM, it was confirmed by the inventor of the present invention that, there is caused an incubation time of 618 seconds, which is longer than 10 minutes. Once the foregoing incubation time has elapsed, there occurs the deposition of the W film with the rate of about 6.6 nm per minute.

SUMMARY OF THE INVENTION

Accordingly, it is a general object of the present invention to provide a novel and useful film-formation process wherein the foregoing problems are eliminated.

Another and more specific object of the present invention is to provide a method of forming a metal film of low specific resistance with high efficiency by a CVD process that uses a metal carbonyl source, such that the film forming process can be conducted at a substrate temperature corresponding to a withstand temperature of a low-K dielectric film while simultaneously maintaining a high film quality and suppressing the incubation time.

Another object of the present invention is to provide a method of forming a metal film from a metal carbonyl compound source, comprising the steps of:

(A) introducing a source material containing a metal carbonyl compound into a process space adjacent to a surface of a substrate to be processed in such a manner that said metal carbonyl compound has a first partial pressure;

(B) depositing a metal film on said surface of said substrate by introducing a source material containing said metal carbonyl compound into said process space in such a mater that said metal carbonyl compound has a second, smaller partial pressure, said step (A) being conducted such that there is caused no substantial deposition of said metal film on said substrate.

According to the present invention, a nucleation process is conducted in the step (A) at the beginning of the CVD process by supplying the metal carbonyl compound to the process space with high partial pressure or concentration so that there are formed crystal nuclei at the surface of the substrate. After the step (A), the metal carbonyl compound is supplied to the process space in the step (B) with an ordinary or lower partial pressure or concentration. Thereby, the deposition of the metal film occurs immediately and the incubation time is eliminated.

It is believed that the crystal nuclei formed on the surface of the substrate are actually formed of metal regions precipitated from the metal carbonyl compound source in the form of an island structure. As such precipitation of the crystal nuclei is caused only under the existence of high concentration metal carbonyl source compound, the metal region thus formed may contain not only the metal such as W but also other elements and species such as C or CO.

Thus, there is a possibility that the quality of the metal film is degraded and the film density is decreased when the deposition of the metal film is continued under the condition of the step (A) and the metal film is formed as a mere continuation of the process of the step (A). Such a metal film may have a large specific resistance.

Thus, according to the present invention, the step (A) is conducted such that there is caused no continuous deposition of the metal film in this step, and the deposition of the desired metal film is achieved only when the step (B) is conducted in such a manner that the concentration of the source compound is reduced. Thus, by conducting the pyrolytic CVD process of the metal film according to the step (A) and further the step (B) as set forth in the present invention, the problem of incubation time, which can reach 300 seconds or more in the case the deposition process is conducted at the substrate temperature of 413° C., is successfully eliminated. It should be noted that the throughput of the substrate processing is improved in the case the step (A) is conducted for 120 seconds, as compared with the case in which no such a nucleation process is conducted and the problem of nucleation time is caused.

Other objects and further features of the present invention will become apparent from the following detailed description when read in conjunction with the attached drawings.

BRIEF DESCRIPTION OF THE DRAWINGS

FIGS. 3A and 3B are diagrams showing a CVD process of a W film on an insulation film according to the first embodiment of the present invention;

FIG. 4 is a diagram showing the nucleation process at the surface of the insulation film in the step of FIG. 3A;

DETAILED DESCRIPTION OF THE PREFERRED EMBODIMENTS

[First Embodiment]

Figure 2:
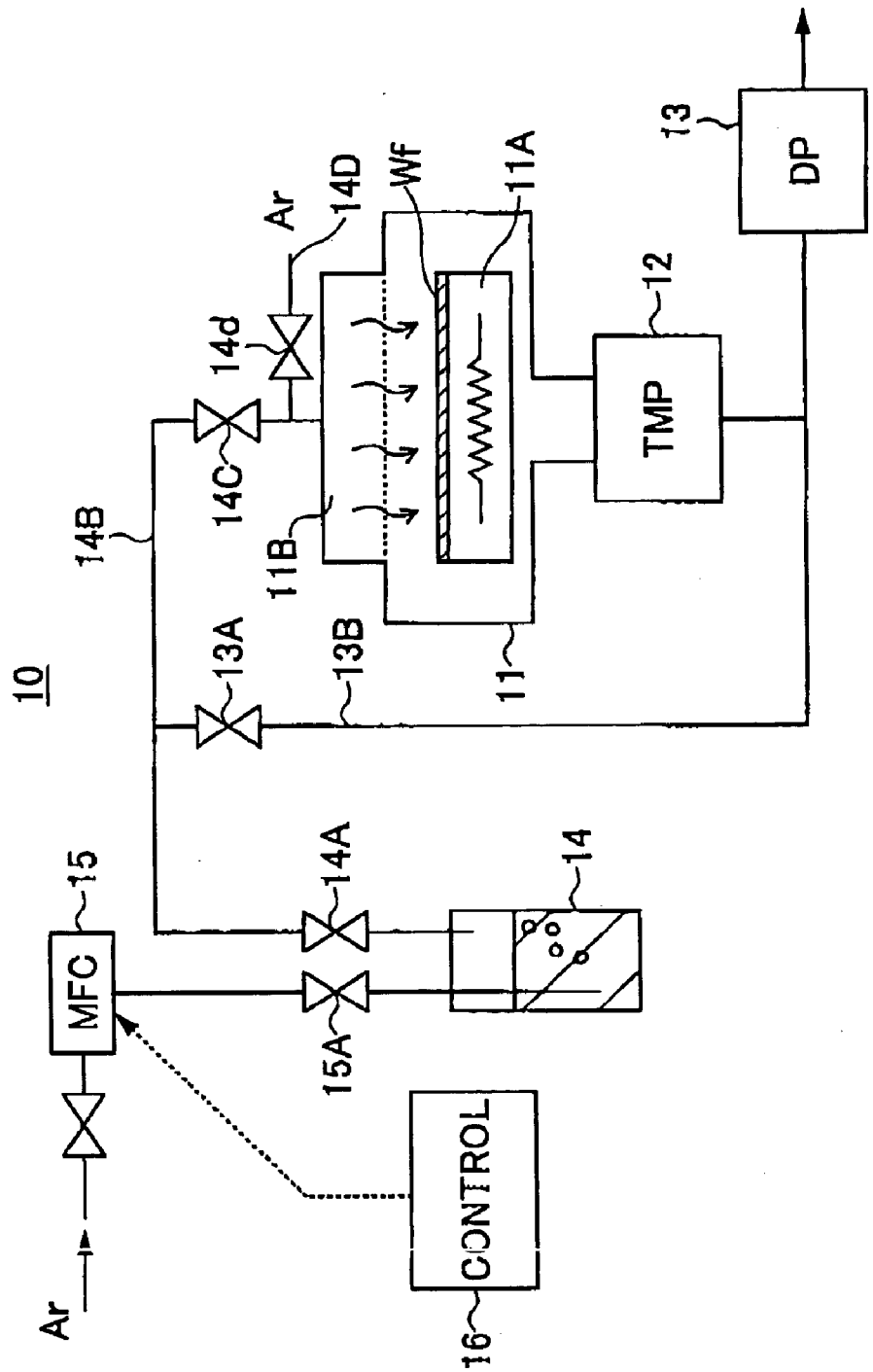
FIG. 2 is a diagram showing the construction of a CVD apparatus according to a first embodiment of the present invention.

FIG. 2 shows the construction of a CVD apparatus 10 used in a first embodiment of the present invention.

Referring to FIG. 2, the CVD apparatus 10 includes a processing vessel 11 evacuated by a turbo molecular pump 12 and a dry pump 13, and a stage 11A is provided in a process space inside the processing vessel 11 for supporting a substrate Wf to be processed.

Further, there is provided a showerhead 11B in the processing vessel 11 so as to introduce a process gas into the process space, wherein a metal carbonyl compound such as $W(CO)_6$ is supplied to the showerhead 11B from a bubbler 14 holding therein a liquid source of the metal carbonyl compound of $W(CO)_6$, together with a carrier gas such as an Ar gas in the form of a gaseous source material. Thereby the gaseous source material is supplied to the showerhead 11B via a valve 14A and a line 14B and further via a valve 14C provided in the line 14B.

The gaseous source material thus supplied is introduced into the processing vessel 11 from the showerhead 11B as represented in FIG. 2 by arrows, and a metal film is deposited on the surface of the substrate Wf as a result of the pyrolytic decomposition reaction of the gaseous source material taking place at the surface of the substrate Wf.

Further, the CVD apparatus 10 of FIG. 2 is provided with a bypass line 13B bypassing the line 14B to the dry pump 13 via a valve 13A. The valve 13A is closed during the phase of conducting an ordinary deposition process but is opened when it is necessary to stabilize the flow rate of the carrier gas carrying the gaseous source material therewith before the commencement of the actual deposition step or when it is necessary to purge the processing vessel 11. When the valve 13A is opened, the valve 14C is closed. As a result, the gaseous source material produced by the bubbler 14 is bypassed to the dry pump directly during such a stabilization phase of the CVD apparatus 10. With this, it becomes possible to maintain the state of the bubbler 14 to be constant irrespective of whether the CVD apparatus 10 is in the deposition process or it is in the stabilization phase for flow rate stabilization or in the purging phase.

In the present embodiment, the bubbler 14 is supplied with a carrier gas via a mass flow controller 15 and further via a valve 15A, and there is caused a bubbling in the bubbler 14 as a result. Thereby, the mass flow controller 15 is controlled by a system controller 16, and the concentration of the metal carbonyl compound in the gaseous source material supplied to the processing vessel 11 is controlled by controlling the mass-flow controller 15 via the system controller 16.

Next, the film formation process of the present embodiment will be described with reference to FIGS. 3A and 3B.

Referring to FIG. 3A, there is formed an $SiO_2$ film 21A on the surface of a silicon substrate 21 with the thickness of about 100 nm, and the silicon substrate 21 is introduced into the CVD apparatus 10 of FIG. 2 in the step of FIG. 3A via a gate valve not illustrated as the substrate Wf. Thereby, the substrate 21 is placed on the stage 11A held at the temperature of 480° C. Further, the bubbler 14 holds therein $W(CO)_6$ as the metal carbonyl compound at the temperature of 25° C.

In the step of FIG. 3A, an Ar gas is further introduced into the processing vessel 21A at the downstream side of the valve 14C from another line 14D through a valve 14d cooperating therewith. Further, the turbo molecular pump 12 and the dry pump 13 are activated and the pressure inside the processing vessel 21 is reduced to about 133 Pa (1 Torr). While holding this state for 30 seconds, the substrate temperature (the temperature at the surface of the substrate) reaches the controlled temperature of 413° C.

Further, in the step of FIG. 3A, the pressure inside the processing vessel 21 is set to about 67 Pa (0.5 Torr), which is higher than the pressure used for ordinary deposition process, and the mass flow controller 15 is controlled by the system controller 16 such that the bubbler 14 is supplied with the Ar carrier gas with the flow rate of 300 SCCM for a duration of about 30 seconds. In the step of FIG. 3A, it should be noted that the partial pressure of $W(CO)_6$ supplied to the process space adjacent to the $SiO_2$ film 21A on the silicon substrate 21 is increased as a result of increase of the pressure in the processing vessel 21. As a result, there is caused a strong supersaturation of $W(CO)_6$ molecules in the foregoing process space, and precipitation of metallic state W occurs promptly on the surface of the film 21A. Thereby, it is believed that there is formed an island structure of W nuclei as represented in FIG. 4.

Next, in the step of FIG. 3B, the pressure inside the processing vessel 12 is reduced to about 8 Pa (0.06 Torr). Further, the mass flow controller 15 is controlled via the system controller 16 so that the Ar carrier gas is supplied to the bubbler 14 with a flow rate of 50 SCCM As a result, there is caused an ordinary supersaturation state of the $W(CO)_6$ molecules in the process space adjacent to the $SiO_2$ film just similarly to the case of ordinary pyrolytic CVD process in the step of FIG. 3B, and there is caused a rapid growth of a W film 22 on the substrate Wf from the island-like W nuclei shown in FIG. 4. Thereby, the W film 22 is grown so as to cover the $SiO_2$ film 21A.

In the present embodiment, it is preferable that the step of FIG. 3A is conducted such that there occurs no substantial deposition of the W film 22 It should be noted that the island-like region of W of FIG. 4 may contain not only W but also C or even CO or oxygen as impurity because of the high partial pressure or concentration of the $W(CO)_6$ source material used in the step of FIG. 3A. Thus, when the process of FIG. 3A is continued to form a W film, there is a substantial possibility that the obtained W film has poor electric and mechanical properties such as high specific resistance and low adhesion because of the impurities incorporated into the film.

Figure 5:
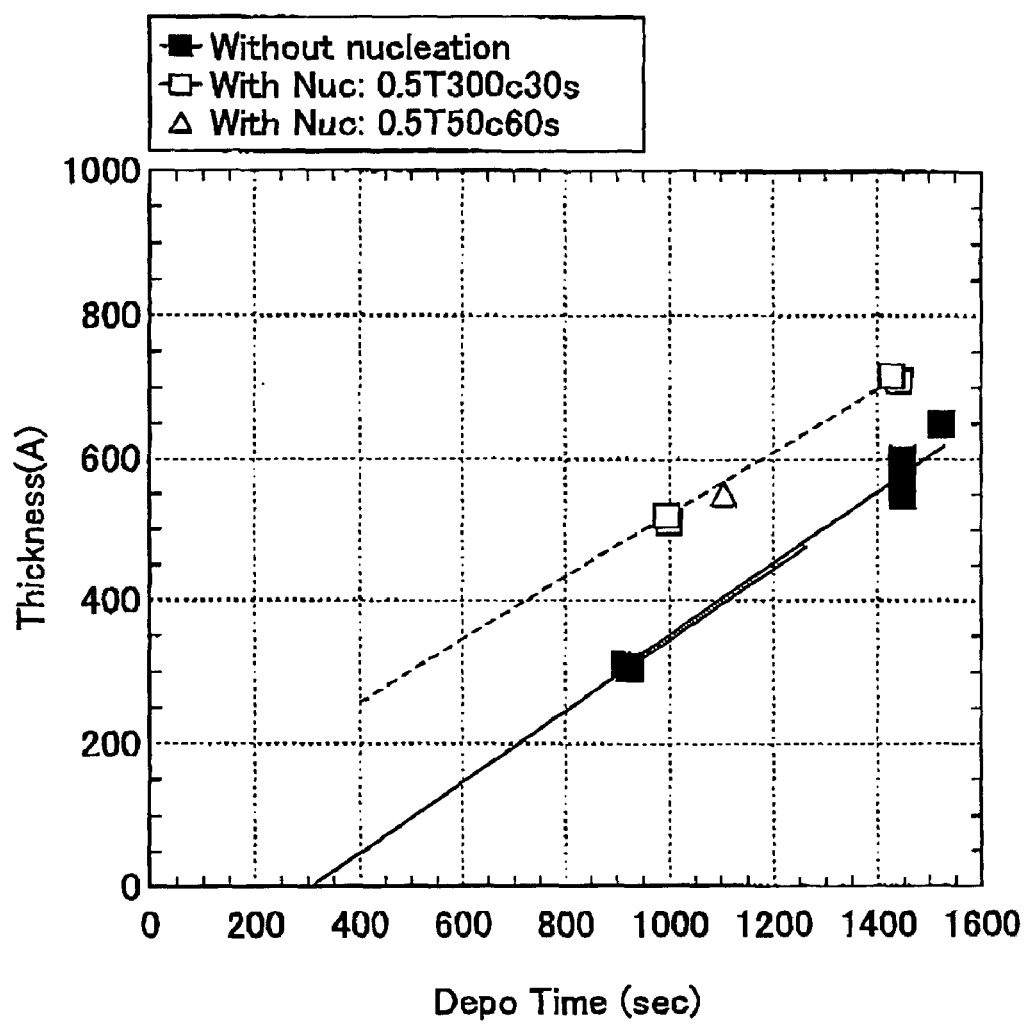
FIG. 5 is a diagram showing the relationship between the thickness and the duration of deposition for the W film formed according to the first embodiment of the present invention.

FIG. 5 shows the relationship between the deposition time and the thickness of the W film 22 obtained for the case the step of FIG. 3B is conducted after conducting the step of FIG. 3A. In the experiment of FIG. 5, it should be noted that the deposition of the W film 22 is conducted in correspondence to the step of FIG. 3B by setting the pressure inside the processing vessel 21 to about 8 Pa (0.06 Torr) and supplying the Ar carrier gas to the bubbler 14 with the flow rate of 50 SCCM, by controlling the mass flow controller by way of the system controller 16. In FIG. 5, it should be noted that the horizontal axis has the origin corresponding to the onset of the step of FIG. 3B.

Figure 1:
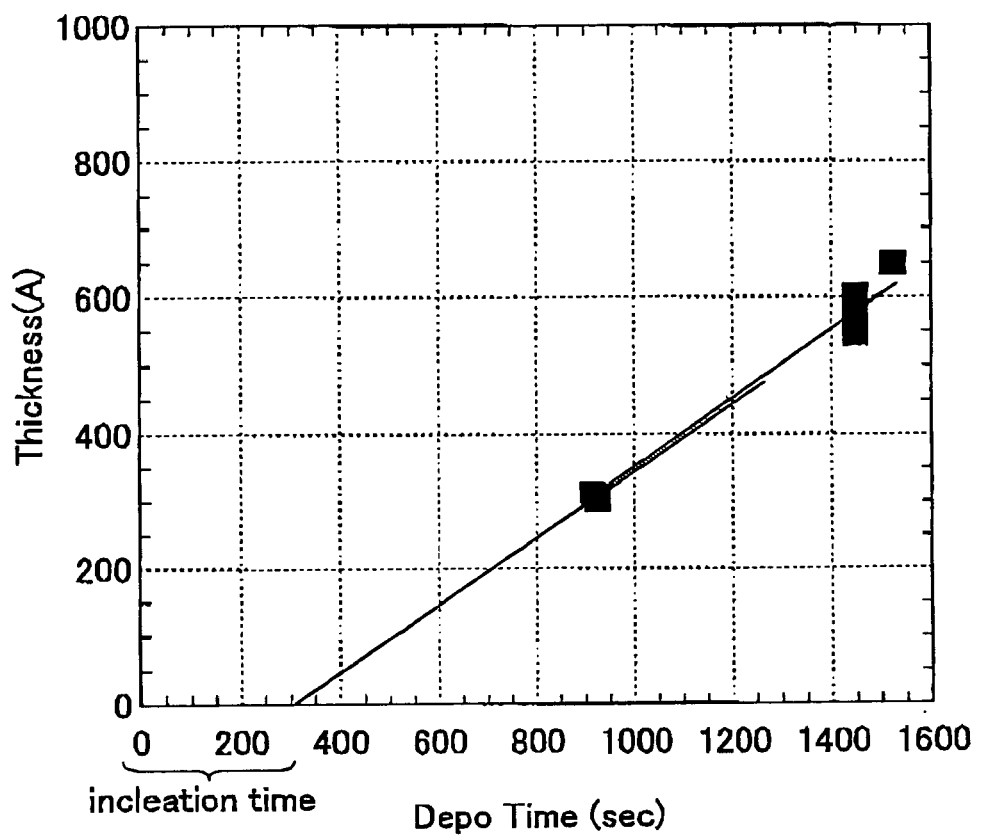
FIG. 1 is a diagram showing the relationship between the thickness of the W film and the duration of the deposition for the case a W film is deposited directly on an insulation film by a CVD process.

Referring to FIG. 5, ■ corresponds to the data points shown in FIG. 1 and represents the case in which the W film is deposited directly on the $SiO_2$ film 21A by omitting the nucleation process of FIG. 3A. On the other hand, □ of FIG. 5 shows the case in which the nucleation process of FIG. 3A is conducted for 30 seconds under the pressure of about 67 Pa (0.5 Torr) while supplying the gaseous source material containing $W(CO)_6$ with the flow rate of 300 SCCM. Further, Δ of FIG. 5 shows the case in which the nucleation process of FIG. 3A is conducted under the same pressure of about 67 Pa (0.5 Torr) as in the case of □ but with the flow rate of the gaseous source material set to 50 SCCM. In the experiment of Δ, the nucleation step of FIG. 3A is continued for 60 seconds.

It should be noted that in the experiment represented by Δ, there is caused a very strong supersaturation state exceeding the case represented by □ at the surface of the $SiO_2$ film 21A in view of the fact that the process pressure has the large value of about 67 Pa and further in view of the fact that the flow rate of the gaseous source material is held simultaneously at the lower value of 50 SCCM. In such a case of using a small flow rate for the gaseous source material, which is a mixture of the Ar carrier gas and $W(CO)_6$, there occurs a relative increase of concentration of $W(CO)_6$ with respect to the Ar carrier gas with decrease of the carrier gas flow rate because of the reduced flow rate of the Ar carrier gas.

Referring to FIG. 5, it can be seen that the thickness of the W film thus obtained increases generally linearly with the deposition time also in the case the nucleation process of FIG. 3A is conducted and that the gradient of the line does not change very much as compared with the case in which the nucleation process is omitted.

On the other hand, the origin of the line for the data □ or Δ is shifted significantly as compared with line for the data ■. Thus, the relationship of FIG. 5 indicates that the deposition of the W film starts substantially immediately when the deposition process of FIG. 3B is started in the case the nucleation process of FIG. 3A is conducted in advance.

In FIG. 5, the extrapolation of the line for the data □ or Δ may seem to indicate that there has been a deposition of a W film 22 of finite thickness at the time of commencement of the step of FIG. 3B, while this is merely an apparent effect. It should be noted that the nucleation process of FIG. 3A is conducted such that there is caused no deposition of the W film as explained with reference to FIG. 4. Thus, as long as the deposition time is zero, the thickness of the continuously formed W film 22 is also zero.

Figure 6:
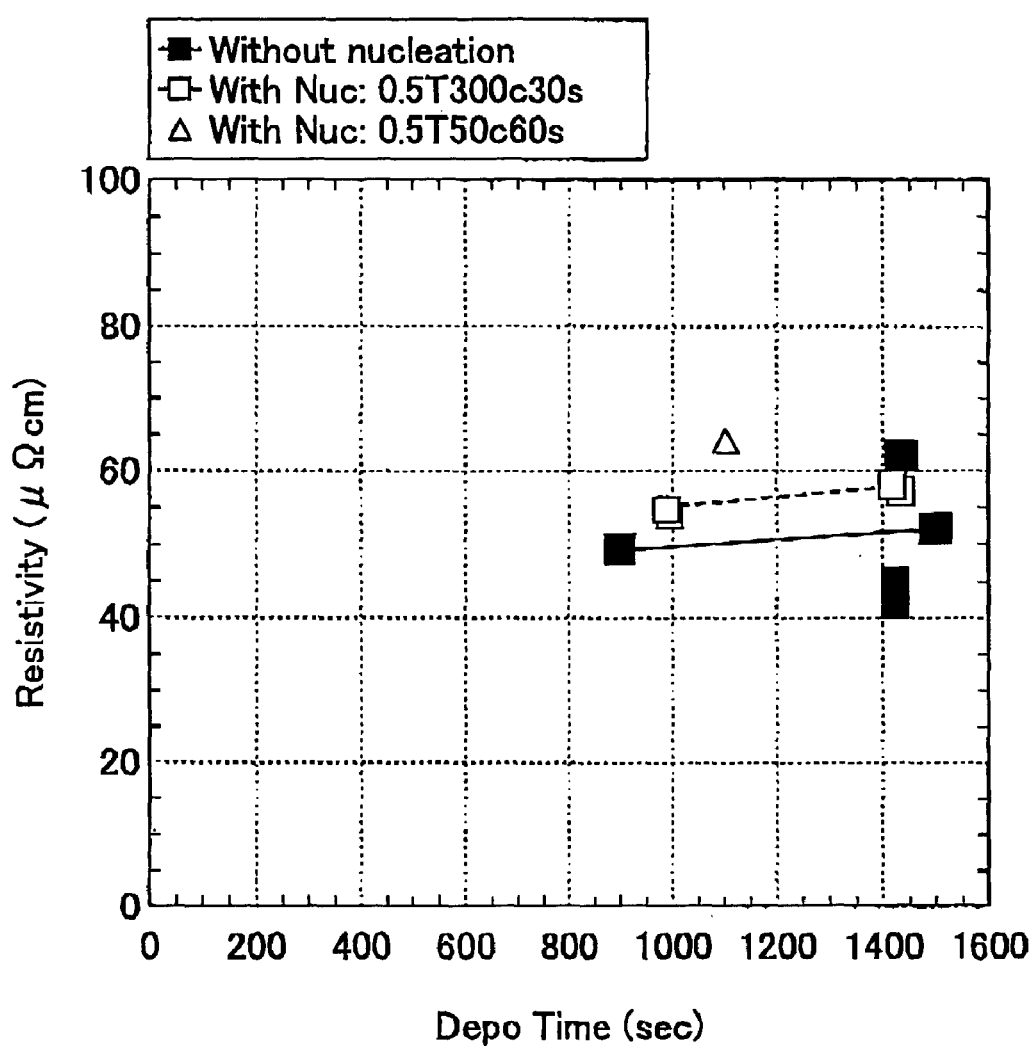
FIG. 6 is a diagram showing the specific resistance of the W film of FIG. 5.

FIG. 6 shows the result of measurement of the specific resistance conducted on the W film 22 thus formed with the thickness of 50 nm, wherein ■ of FIG. 6 represents the case in which no nucleation process was conducted similarly to the case of FIG. 5, while □ represents the case in which the nucleation process of FIG. 3A was conducted for 30 seconds under the pressure of about 67 Pa (0.5 Torr) while supplying the Ar carrier gas with the flow rate of 300 SCCM. Further, Δ represents the case in which the nucleation process of FIG. 3A was conducted for 60 seconds under the pressure of about 67 Pa (0.5 Torr) while supplying the Ar carrier gas with the flow rate of 50 SCCM, similarly to the case of FIG. 5.

Referring to FIG. 6, it can be seen that the specific resistance increases slightly in the case of Δ as compared with the case of ■ in which no nucleation process was conducted. However, the difference is not deemed substantial, and it is concluded that the W film formed with increased throughput by way of conducting a nucleation process provides electrical properties substantially equivalent to the conventional W film formed without such a nucleation process.

In FIG. 6, it is noted that the W film represented by Δ shows a slightly increased specific resistance with respect to the case shown by ■ or □ as noted above, while this may indicate the situation in which the island regions of W shown in FIG. 4 are interconnected with each other under the condition of very strong supersaturation, resulting in formation of a continuous or partially continuous W layer containing a large amount of impurity at the bottom part of the W film 22. Thus, it can be understood that the case represented by Δ in FIG. 6 actually represents the limit of exposure dose, defined as [W(CO)$_6$ partial pressure]×[time], in the nucleation process of FIG. 3A.

Thus, according to the present invention, it becomes possible to deposit a high-quality W film 22 of low specific resistance directly on the SiO$_2$ film at low temperature while avoiding appearance of incubation time, by conducting the nucleation process shown in FIG. 3A in advance to the ordinary deposition step of FIG. 3B such that there occurs no deposition of a continuous W film during the nucleation step of FIG. 3A.

In the illustrated example of the present embodiment, the partial pressure of W(CO)$_6$ is increased in the process space adjacent to the surface of the SiO$_2$ film 21A by increasing the process pressure to about 67 Pa (0.5 Torr). However, the pressure during the nucleation process of FIG. 3A is not limited to such a specific pressure but a higher pressure may also be used. In the deposition step of FIG. 3B, on the other hand, it is necessary to reduce the process pressure to about 13 Pa (0.1 Torr) or less by using the turbo molecular pump 13. Thus, it is preferable to set the process pressure in the step of FIG. 3A not to exceed about 70 Pa (0.5 Torr) from the viewpoint of the operational pressure range of the turbo molecular pump 13.

[Second Eembodiment]

Figure 7:
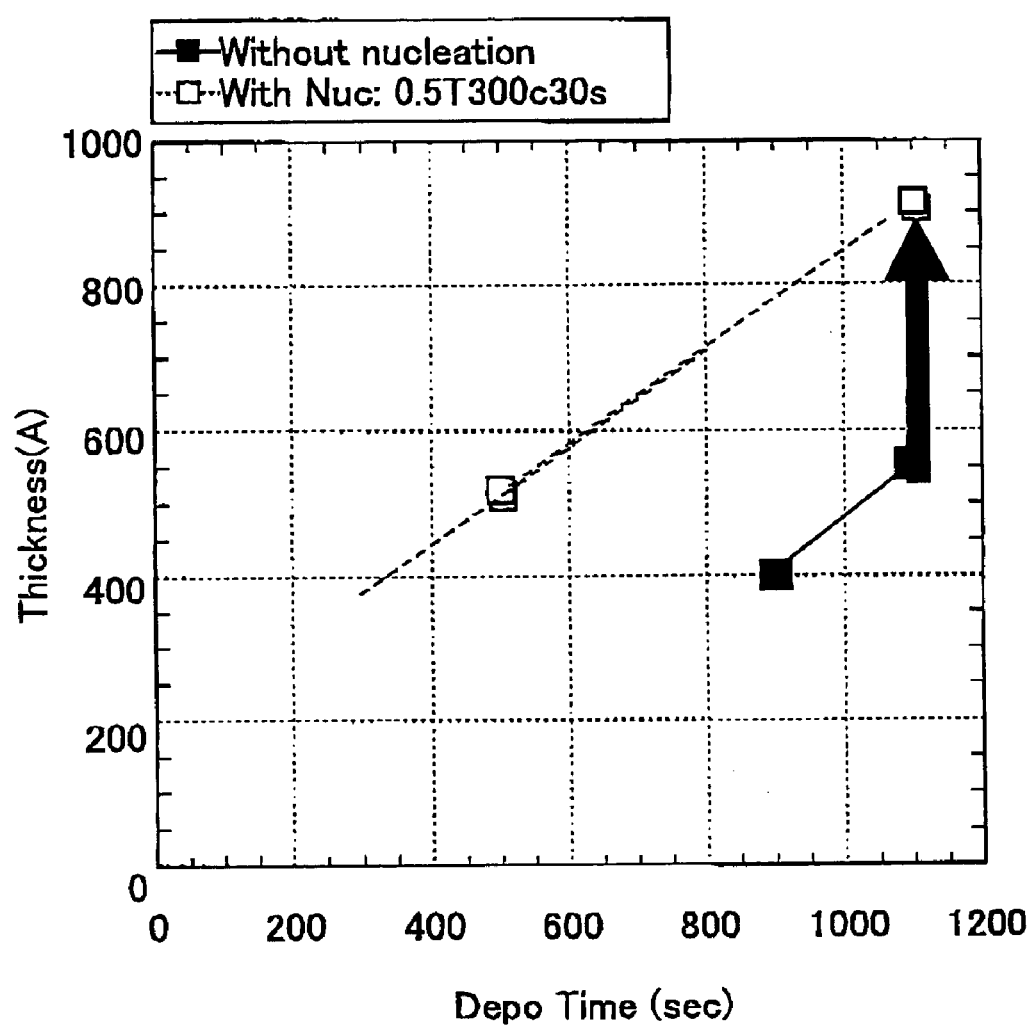
FIG. 7 is a diagram showing the relationship between the thickness and the duration of deposition of the W film formed according to a second embodiment of the present invention.

FIG. 7 shows the relationship between the W film and the deposition time for the case a CVD process of a W film is conducted at the substrate temperature of 368° C. while using W(CO)$_6$ as the source material. In the description below, reference will be made to FIGS. 3A and 3B as well as FIG. 4.

In the deposition process of FIG. 7, too, the CVD apparatus 10 of FIG. 2 is used with the process in which a nucleation step corresponding to the step of FIG. 3A is conducted first by supplying W(CO)$_6$ on the SiO$_2$ film 21A with a high pressure, followed by conducting a deposition step corresponding to the step of FIG. 3B for depositing a W film on the SiO$_2$ film by supplying W(CO)$_6$ with a lower partial pressure. In FIG. 7, too, it should be noted that the origin of the horizontal axis corresponds to the commencement of the deposition step of FIG. 3B.

In the embodiment of FIG. 7, the substrate temperature is set to 368° C. throughout the nucleation step of FIG. 3A and the deposition step of FIG. 3B, and the nuclei of W are formed on the surface of the SiO$_2$ film 21A in the step of FIG. 3A by supplying the gaseous source material containing W(CO)$_6$ formed in the bubbler 14 at the bubbler temperature of 25° C., to the surface of the SiO$_2$ film 21A with the carrier gas flow rate of 50 SCCM for 120 seconds under the process pressure of 67 Pa (0.5 Torr), wherein the process pressure is pressure of the process space inside the processing vessel 11.

After the step of FIG. 3A, the gaseous source material is supplied from the bubbler 14 held at the same bubbler temperature to the process space inside the processing vessel 11, with the carrier gas flow rate of 50 SCCM while setting the process pressure of the process space to about 13 Pa (0.1 Torr). As a result, the W film 22 is formed on the SiO$_2$ film 21A with a desired thickness.

Referring to FIG. 7, it can be seen that there appears an incubation time of about 400 seconds in the case of ■ in which the nucleation step is omitted. In the case of □ in which the nucleation step is conducted, on the other hand, the incubation time disappears and the deposition starts substantially at the same time to the commencement of the deposition step of FIG. 3B.

In FIG. 7, the extrapolation of the line for the data □ may seem to indicate that there has been a deposition of a W film 22 of finite thickness at the time of commencement of the step of FIG. 3B, while this is merely an apparent effect. It should be noted such that there is caused no deposition of the W film as explained with reference to FIG. 4. Thus, as long as the deposition time is zero, the thickness of the continuously formed W film 22 is also zero.

Figure 8:
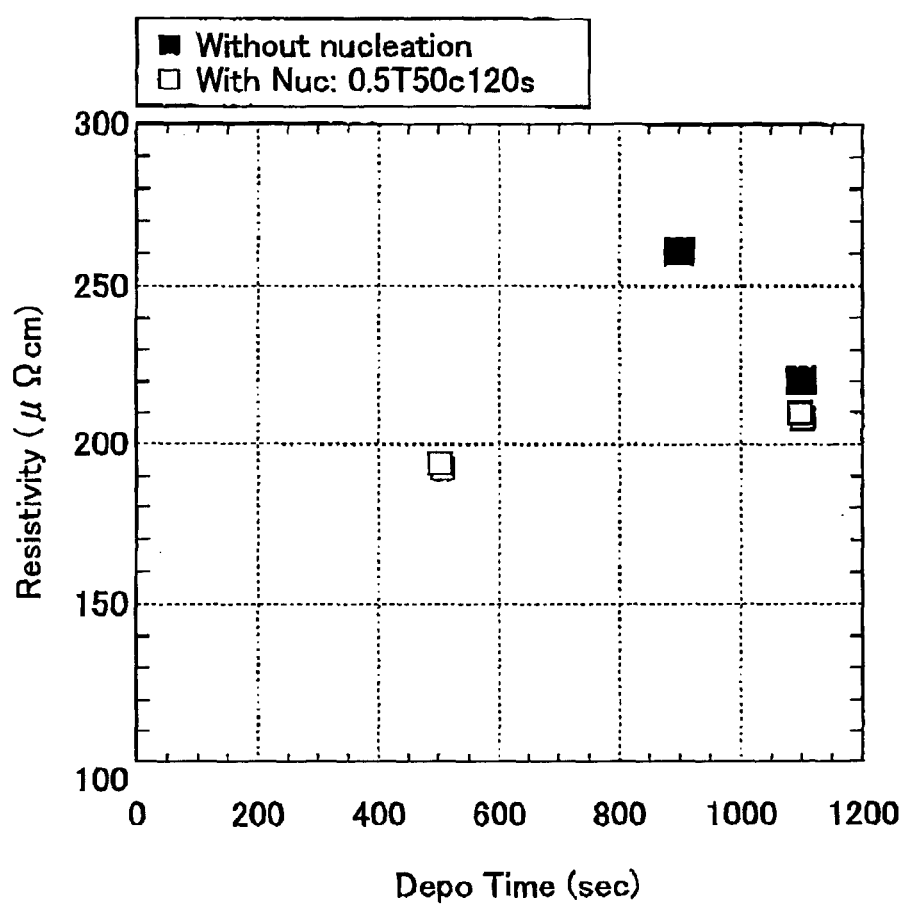
FIG. 8 is a diagram showing the specific resistance of the W film of FIG. 7.

FIG. 8 shows the specific resistance of the W film 22 obtained in the experiment of FIG. 7 with the thickness of 50 nm.

Referring to FIG. 8, it can be seen that the W film formed with the nucleation process has a smaller specific resistance as compared with the W film formed without such a nucleation process.

[Third Embodiment]

Figure 9:
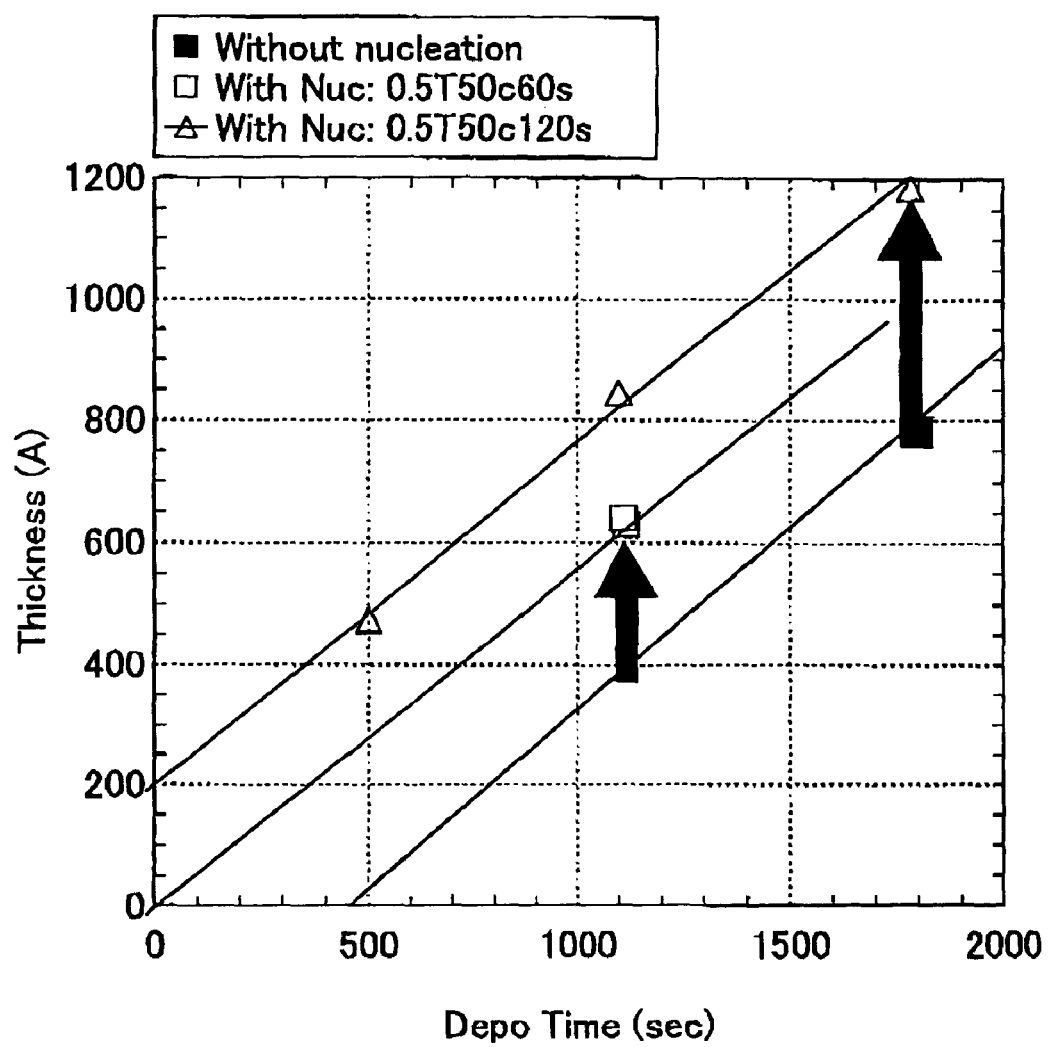
FIG. 9 is a diagram showing the relationship between the W film and the duration of the deposition of the W film formed according to a third embodiment of the present invention.

FIG. 9 shows the relationship between the W film and the deposition time for the case the deposition of the W film is conducted by a CVD process at 338° C. while using W(CO)$_6$ as a source material.

In the experiment of FIG. 9, too, the CVD apparatus 10 of FIG. 2 is used similarly to the previous embodiments and the nucleation process of FIG. 3A is conducted at the beginning of the presses by supplying W(CO)$_6$ on the surface of the SiO$_2$ film 21A with high partial pressure. After the nucleation process, the deposition of the W film is conducted on the SiO$_2$ film 21A by conducting the process corresponding to the step of FIG. 3B by supplying W(CO)$_6$ with a lower partial pressure. In FIG. 9, too, the origin of the horizontal axis is set to the timing of commencement of the process of FIG. 3B.

In the embodiment of FIG. 9, the substrate temperature is held at 338° C. throughout the nucleation process and the deposition process, and the gaseous source material containing W(CO)$_6$ formed in the bubbler 14 at the bubbler temperature of 25° C. is supplied to the surface of the SiO$_2$ film 21A in the nucleation step of FIG. 3A under the process pressure of 67 Pa (0.5 Torr) with the carrier gas flow rate of 50 SCCM for 60 seconds or 120 seconds. Thereby, the nuclei of W are formed on the surface of the SiO$_2$ film 21A.

After the step of FIG. 3A, the process pressure inside the processing vessel 11 is set to about 13 Pa (0.1 Torr) in the step of FIG. 3B and the gaseous source material is supplied from the bubbler 14, held at the same bubbler temperature, is supplied with the carrier gas flow rate of 50 SCCM With this, the W film 22 is deposited on the SiO$_2$ film 21A with a desired thickness.

Referring to FIG. 9, □ represents the relationship between the deposition time and the film thickness for the case the W film 22 is formed after conducting the nucleation process for 60 seconds, while Δ represents a similar relationship for the case in which the W film 22 is formed after conducting the nucleation process for 120 seconds. Further, ■ of FIG. 9 shows a similar relationship for the case the nucleation process is omitted.

Referring to FIG. 9, it can be seen that there appears an incubation time of about 400 seconds in the case of ■. On the other hand, the incubation time disappears in the case of Δ or □ in which the nucleation process of FIG. 3A is conducted. In such a case, it can be seen that there is caused the deposition of the W film substantially simultaneously to the commencement of the deposition step of FIG. 3B.

Figure 10:
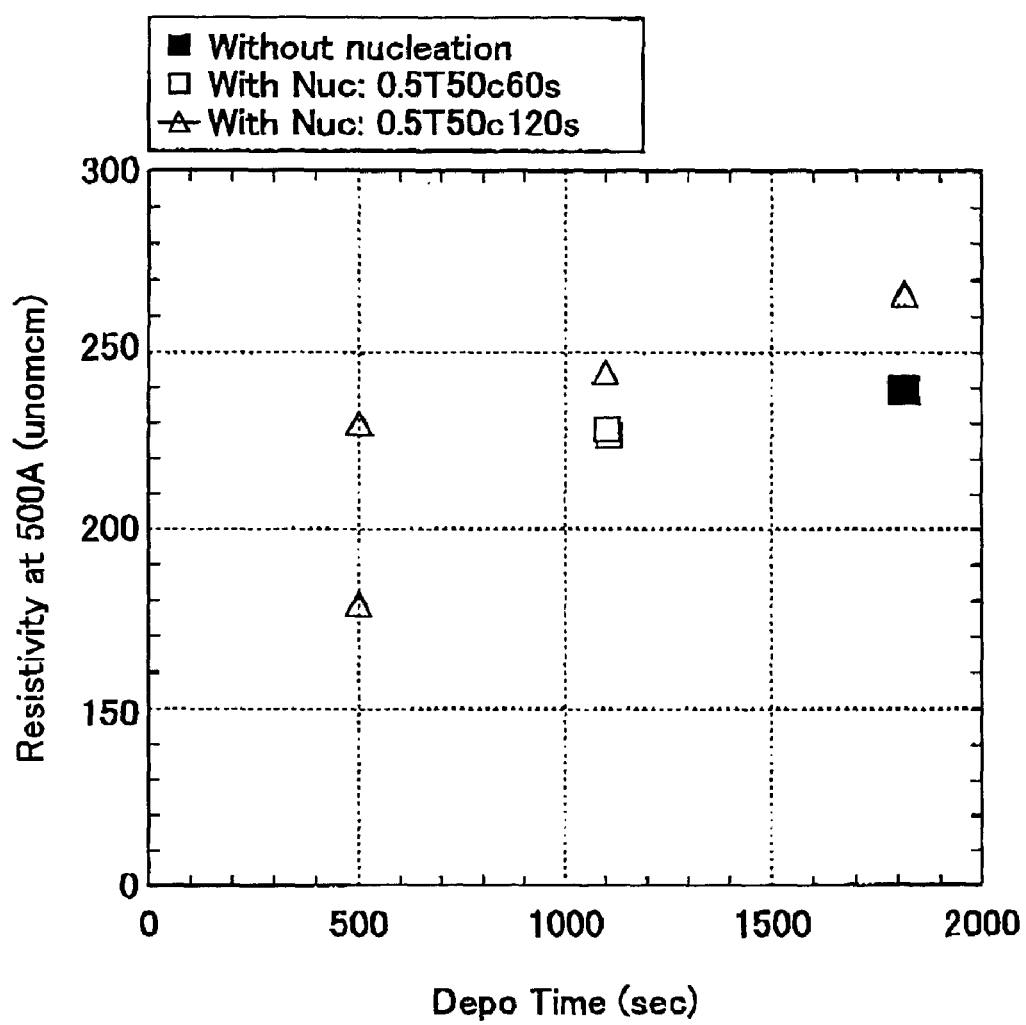
FIG. 10 is a diagram showing the specific resistance of the W film of FIG. 9.

FIG. 10 shows the specific resistance of the W film 22 formed in the experiment of FIG. 9 with the thickness of 50 nm.

Referring to FIG. 10, it can be seen that a specific resistance comparable to that of the W film formed without conducting the nucleation process, is achieved in the case of the W film 22 represented by □. In the case of the W film 22 represented by Δ, on the other hand, it can be seen that the specific resistance is slightly larger than the case the W film is formed without conducting the nucleation process. It is believed that this slight increase of the specific resistance is caused as a result of increased amount of W nuclei or formation of partly continuous W islands on the surface of the $SiO_2$ film 21A. It should be noted that the interpolated thickness of the W film at the start of the deposition process provides a very large value of about 20 nm or more for the intercept in the data Δ of FIG. 10. As noted previously, the W nuclei at the surface of the $SiO_2$ film 21A contains various impurities such as C or CO originating from the source compound and shows the tendency of increased specific resistance. Thus, there is a possibility that the existence of such a relatively thick W layer of high impurity concentration at the bottom part of the W film 22 may be the reason of this increased specific resistance.

In various embodiments explained heretofore, the strong supersaturation of $W(CO)_6$ is achieved on the surface of the $SiO_2$ film 21A by increasing the process pressure (internal pressure) of the decreasing the carrier gas flow rate in the step of FIG. 3A in addition to such an increase of the process pressure. On the other hand, the present invention is not limited to such a specific procedure, and the strong supersaturation state may be realized by merely using a smaller carrier gas flow rate in the step of FIG. 3A as compared with the step of FIG. 3B.

[Fourth Embodiment]

Figure 11:
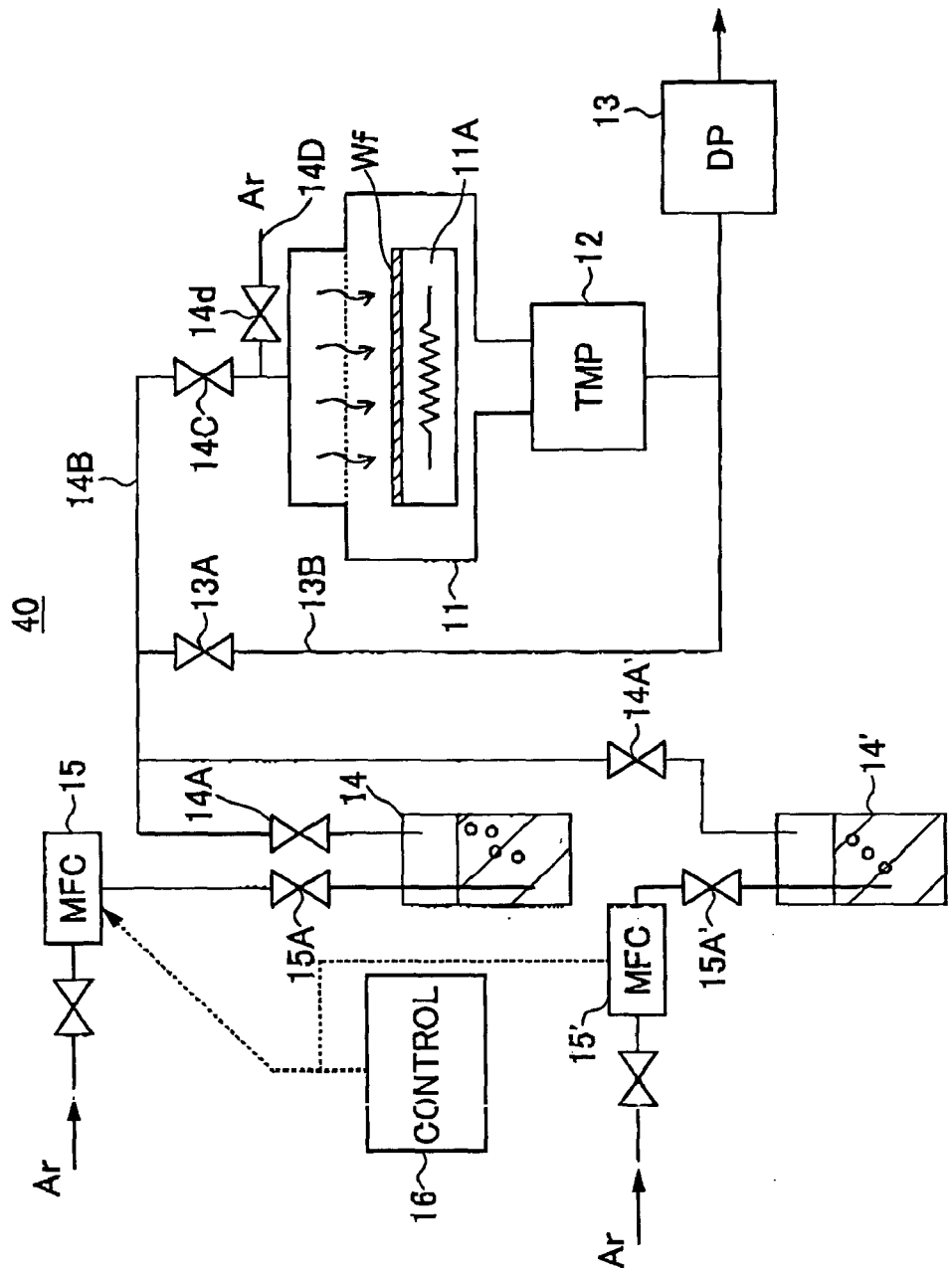
FIG. 11 is a diagram showing the construction of a CVD apparatus according to a fourth embodiment of the present invention.

FIG. 11 shows the construction of a CVD apparatus 40 used in a fourth embodiment of the present invention, wherein those parts corresponding to the parts described previously are designated by the same reference numerals and the description thereof will be omitted.

In the nucleation step of FIG. 3A, it is possible to increase the supply rate of $W(CO)_6$ by using a higher bubbler temperature for the bubbler 14 as compared with the step of FIG. 3B. While switching of such a bubbler temperature is possible in the CVD apparatus 10 of FIG. 2, such a change of the bubbler temperature is generally not preferable or realistic in view of the fact that the bubbler temperature has to be controlled with extreme precision.

Thus, FIG. 11 shows the constriction in which an additional bubbler 14' is provided for holding the same $W(CO)_6$ source at a different bubbler temperature. Thus, when the concentration of $W(CO)_6$ is to be increased, the CVD apparatus 40 of FIG. 11 switches the bubbler 14 to the bubbler 14'.

More specifically, the additional bubbler 14' is supplied with an Ar carrier gas from another mass flow controller 15' via a valve 15A', and the vapor of $W(CO)_6$ formed as a result of the bubbling is supplied to the line 14B via a valve 14A'.

In the example of FIG. 11, the temperature of the bubbler 14' is set higher than the temperature of the bubbler 14, and the valves 15A' and 14A' are opened by the system controller 16 during the nucleation phase corresponding to FIG. 3A. Thereby, the vapor of $W(CO)_6$ is supplied to the line 14B. During this period, the valves 14A and 15A cooperating with the bubbler 14 are closed.

During the deposition step of FIG. 3B, on the other hand, the valves 14A' and 15A' are closed and the valves 14A and 15A are opened. Thereby, the vapor of $W(CO)_6$ in the bubbler 14 held at 25° C. is supplied to the line 14B together with the carrier gas.

Further, it should be noted that the present invention is not limited to the case of using $W(CO)_6$ for the source material. Thus, the present invention is useful also in the case of conducting a CVD process of other metal films such as the one using $Co(CO)_6$, $Mo(CO)_6$, $[Rh(CO)_4]_4$, and the like.

Further, the insulation film 21A on which the deposition of the W film takes place is not limited to such an $SiO_2$ film, but other various low-K inorganic insulation films having a specific dielectric constant of 3.0 or less such as a hydrogen silsesquioxane film, various low-K organic insulation films such as an aromatic polyether film, or other various organic and inorganic porous insulation films can be used for the insulation film 21A.

Further, the present invention is not limited to the embodiments described heretofore, but various variations and modifications may be made without departing from the scope of the invention.

The present invention is based on a Japanese priority patent application 2002-205516 filed on Jul. 15, 2003, the entire contents of which are incorporated herein as reference.

What is claimed is:

1. A method of forming a metal film from a metal carbonyl compound source, comprising the steps of:
   (A) introducing a gaseous source material containing a metal carbonyl compound into a process space adjacent to a surface of a substrate to be processed in such a manner that said metal carbonyl compound has a first partial pressure;
   (B) depositing a metal film on said surface of said substrate by introducing a gaseous source material containing said metal carbonyl compound into said process space in such a manner that said metal carbonyl compound has a second, smaller partial pressure,
   said step (A) being conducted such that there is caused formation of nuclei on said substrate without causing substantial deposition of said metal film on said substrate.

2. A method as claimed in claim 1, wherein said step (A) is conducted by setting the temperature of a source vessel holding said metal carbonyl compound to a first temperature, and wherein said step (B) is conducted by setting the temperature of a source vessel holding said metal carbonyl compound to a second, lower temperature.

3. A method as claimed in claim 1, wherein said step (A) is conducted by setting a flow rate of a carrier gas to a first value when supplying said gaseous source material containing said metal carbonyl compound to said process space and wherein said step (B) is conducted by setting said flow rate of said carrier gas to a second, larger value.

4. A method as claimed in claim 1, wherein said step (A) is conducted by supplying said gaseous source material containing said metal carbonyl compound into said process space while setting a pressure of said process space to a first pressure, and wherein said step (B) is conducted by supplying said gaseous source material containing said metal carbonyl compound into said process space while setting a pressure of said process space to a second, lower pressure.

5. A method as claim 4, wherein said first pressure is about 70 Pa or less.

6. A method as claimed in claim 4, wherein said second pressure is about 13 Pa or less.

7. A method as claimed in claim 1, wherein said step (A) and said step (B) are conducted at a substrate temperature of less than 500° C.

8. A method as claimed in claim 1, wherein said step (A) and said step (B) are conducted at a substrate temperature of less than 400° C.

9. A method as claimed in claim 1, wherein a surface of said substrate is covered with an insulation film.

10. A method as claimed in claim 1, wherein said metal carbonyl compound is selected from the group consisting of $W(CO)_6$, $Co(CO)_6$, $Mo(CO)_6$ and $[Rh(CO)_4]_4$.

11. A method as claimed in claim 1, wherein said steps (A) and (B) are conducted continuously in a common processing vessel.

* * * * *